United States Patent [19]

Falabella

[11] Patent Number: 5,468,363
[45] Date of Patent: Nov. 21, 1995

[54] MAGNETIC-CUSP, CATHODIC-ARC SOURCE

[75] Inventor: Steven Falabella, Livermore, Calif.

[73] Assignee: Regents of the University of California, Oakland, Calif.

[21] Appl. No.: 232,661

[22] Filed: Apr. 25, 1994

[51] Int. Cl.[6] .................................... C23C 14/32
[52] U.S. Cl. ............... 204/298.41; 204/192.38; 313/157; 315/111.41; 250/426
[58] Field of Search .......... 204/192.38, 298.41; 315/111.41; 313/157; 250/426; 427/580

[56] References Cited

U.S. PATENT DOCUMENTS

| | | | |
|---|---|---|---|
| 4,929,321 | 5/1990 | Buhl | 204/298.41 |
| 5,279,723 | 1/1994 | Falabella et al. | 204/192.38 |
| 5,282,944 | 2/1994 | Sanders et al. | 204/192.38 |
| 5,306,407 | 4/1994 | Hauzer et al. | 204/298.41 X |

OTHER PUBLICATIONS

Sanders et al., "Coatings . . . Experiments", Thrust Area Report, FY 1990, pp. 4–14 to 4–18.
Falabella et al., "Comparison . . . sources", J. Vac. Sci. Technol. A 10(2), Mar./Apr. 1992, pp. 394–397.

Primary Examiner—Nam Nguyen
Attorney, Agent, or Firm—Henry P. Sartorio; L. E. Carnahan

[57] ABSTRACT

A magnetic-cusp for a cathodic-arc source wherein the arc is confined to the desired cathode surface, provides a current path for electrons from the cathode to the anode, and utilizes electric and magnetic fields to guide ions from the cathode to a point of use, such as substrates to be coated. The magnetic-cusp insures arc stability by an easy magnetic path from anode to cathode, while the straight-through arrangement leads to high ion transmission.

20 Claims, 2 Drawing Sheets

MAGNETIC-CUSP, CATHODIC-ARC SOURCE

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is directed to an ion source using a cathodic vacuum arc, particularly to an ion source using a filtered cathodic-arc for the production of dense, adherent coatings, for example, wherein the filtering eliminates or reduces macro-particles normally produced by the cathodic arc, and more particular to a magnetic-cusp for a cathodic-arc which allow high magnetic fields required for good ion transport, while providing a low impedance path for electrons from cathode to anode, giving stable arc discharges.

Cathodic arcs produce a highly ionized metal vapor which has proven useful in the production of dense, adherent coatings. For many applications, macro-particles normally produced by the cathodic arc are unacceptable and must be filtered out. Thus, the separation or elimination of macro-particles from the ion flux produced by a cathodic arc discharge has long been the goal of many research efforts.

A number of approaches have been advanced for the removal of such macro-particles, which include the use of filtering. Recently, two micro-particle filtered cathodic arc sources have been developed which address the basic issues of arc control, transport of metal ions through the filter, and shielding the source from line-of-sight of the parts to be coated. Both of these micro-particles filtered cathodic arc sources rely on electrostatic fields produced by the flow of magnetically constrained electrons through the filter to guide the ions from the cathode to a substrate to be coated. These filtered cathodic arc sources are disclosed and claimed in U.S. Pat. No. 5,279,723 issued Jan. 18, 1994 to S. Falabella et al., and U.S. Pat. No. 5,282,944 issued Feb. 1, 1994 to D. M. Sanders et al.

While these above-identified filtered cathodic arc sources provide the capability of producing coatings without blemishes caused by macro-particles, the present invention provides an improved cathodic-arc arrangement for the filtered cathodic arc source of above-referenced U.S. Pat. No. 5,279,723 utilizing a magnetic cusp which provides a straight-through magnetic field which matches well to the "knee-type" or bent macro-particle filter arrangement for this patent. The magnetic cusp of this invention allows high magnetic fields required for good ion transport, yet provides a low impedance path for electrons from cathode to anode, giving stable arc discharges.

SUMMARY OF THE INVENTION

An object of the present invention is to provide an ion source using a magnetic-cusp.

A further object of the invention is to provide a filtered cathodic ion source having a magnetic-cusp.

Another object of the invention is to utilize a magnetic-cusp in a filtered cathode arc ion source using a bent magnetic field for eliminating macro-particles.

Another object of the invention is to provide a cathodic ion source with a magnetic-cusp arrangement for providing high magnetic fields for good ion transport while producing a low impedance path for electrodes from cathode to anode.

Other objects and advantages of the invention will become apparent from the following description and accompanying drawings. The essential feature of this invention is the cusp magnetic field arrangement. The cathode is located in the center of a short solenoid coil, and at the surface of the cathode the field is nearly parallel (or expanding), and the arc is constrained to the end of the cathode by the sloped sides thereof (or by diverging field). A similar solenoid coil is located a short distance away with the magnetic field direction being opposite to the first coil, which creates a plane of zero magnetic field between the coils. An annular anode is placed at this zero field location, which provides a straight-through magnetic field for good ion transport, and insures arc stability by the easy magnetic path for electrons from anode to cathode.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to a magnetic-cusp cathodic-arc source which is particularly useful in filtered cathodic-arc arrangements for coating parts, etc., while preventing macro-particles from striking the part to be coated. The magnetic-cusp arrangement of this invention is particularly applicable in filtered cathodic-arc systems which use a bent magnetic field for filtering out macro-particles produced by the cathodic-arc, such as that of above-referenced U.S. Pat. No. 5,279,723.

A cathodic-arc source must provide for: 1) the confinement of the arc to the desired cathode surface, 2) a current path for electrons from the cathode to the anode, and 3) an electric and magnetic field configuration to guide ions from the cathode to point of use such as a substrate or part to be coated. The magnetic cusp arrangement of this invention accomplishes all three above-identified requirements. Arc stability is insured by an easy magnetic path from anode to cathode, while the straight-through configuration leads to high ion transmission.

Figure 1:
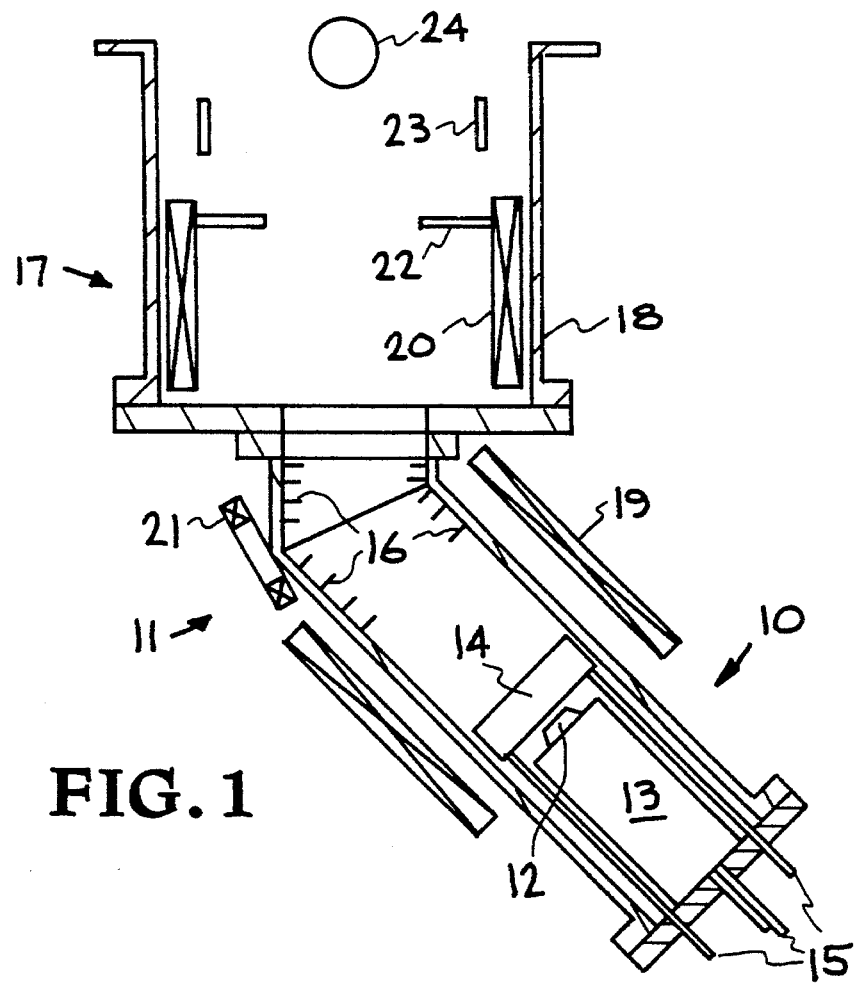
FIG. 1 is a schematic view of a bent magnetic field type filtered cathodic arc source for which the invention is particularly adapted.

FIG. 1 schematically illustrates a "knee-type" or bent magnetic field macro-particle filter cathodic arc source, similar to that of above-referenced U.S. Pat. No. 5,279,723. Ions leave the cathode and travel through a 45° bend to separate out macro-particles. Electrons flowing to the ring anode in the chamber produce the electrostatic field that guides the ions. To prevent macro-particles from bouncing off the walls of the chamber and thus reaching the part to be coated, a plurality of baffles are used to trap the macro-particles. The filtered ion source of FIG. 1 basically consists of a cathodic arc source, generally indicated at 10, coupled to a macro-particle filter, generally indicated at 11. The arc source 10 is basically composed of a cathode assembly including a cathode (target) 12 mounted on a shield or target holder 13, an anode 14 spaced from the cathode assembly, and water lines 15 for cooling the cathode 12 and anode 14. The cathode (target) 12 is of a frustum-shape and due to the tapered sides thereof, the arc is confined to the end thereof for increased target material utilization. The macro-particle filter 11 includes a housing bent at 45° having baffles 16 secured to the walls, with a section of the housing secured to a vacuum chamber, generally indicated at 17, having a wall 18. A coil 19 is located about the housing of filter 11 and a coil 20 is located within vacuum chamber wall 18. If desired a steering coil 21 may be located adjacent the outer bend section of the housing of the filter 11. The vacuum chamber 17 is provided with an annular baffle 22 to block any macro-particles not caught in baffles 16 and a secondary or auxiliary anode 23 located near the substrate or part to be coated, indicated at 24, for introducing reactive gases near the part to be coated.

Figure 2:
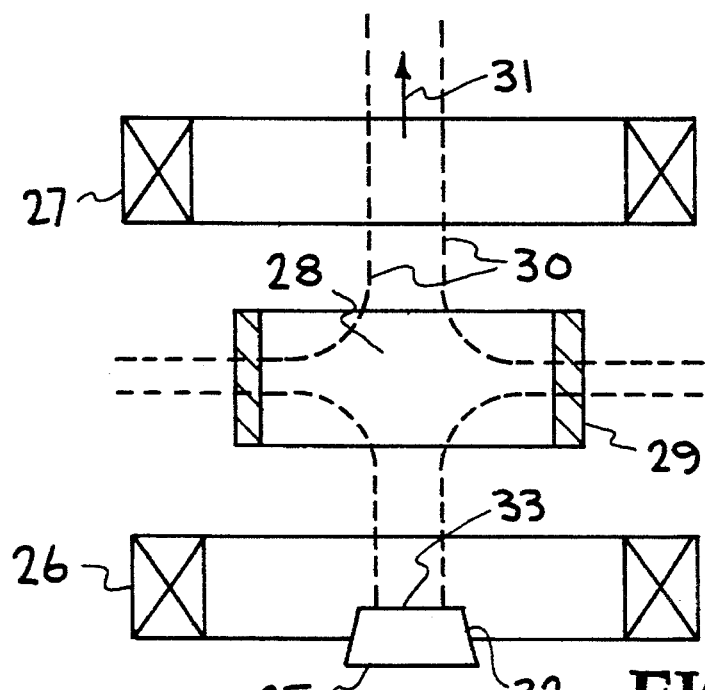
FIG. 2 illustrates the magnetic-cusp cathodic-arc source of this invention.

Inasmuch as the details and function of the ion source 10, the macro-particle filter 11 and the vacuum chamber 17 of FIG. 1 do not constitute part of this invention and are set forth for a better understanding of the present invention, illustrated in FIG. 2, a more detailed description herein is not deemed necessary. However, since FIG. 1 is similar to the filtered ion source of above-referenced U.S. Pat. No. 5,279,723, the details and function of the macro-particle filter and vacuum chamber thereof are incorporated herein by reference thereto.

The magnetic cusp source illustrated in FIG. 2 is designed, for example, to replace the cathodic arc source 10 of FIG. 1, and is provided with appropriate shielding and water cooling as shown in FIG. 1. The essential feature of the present invention is the magnetic field arrangement illustrated in FIGS. 2 and 3.

Figure 3:
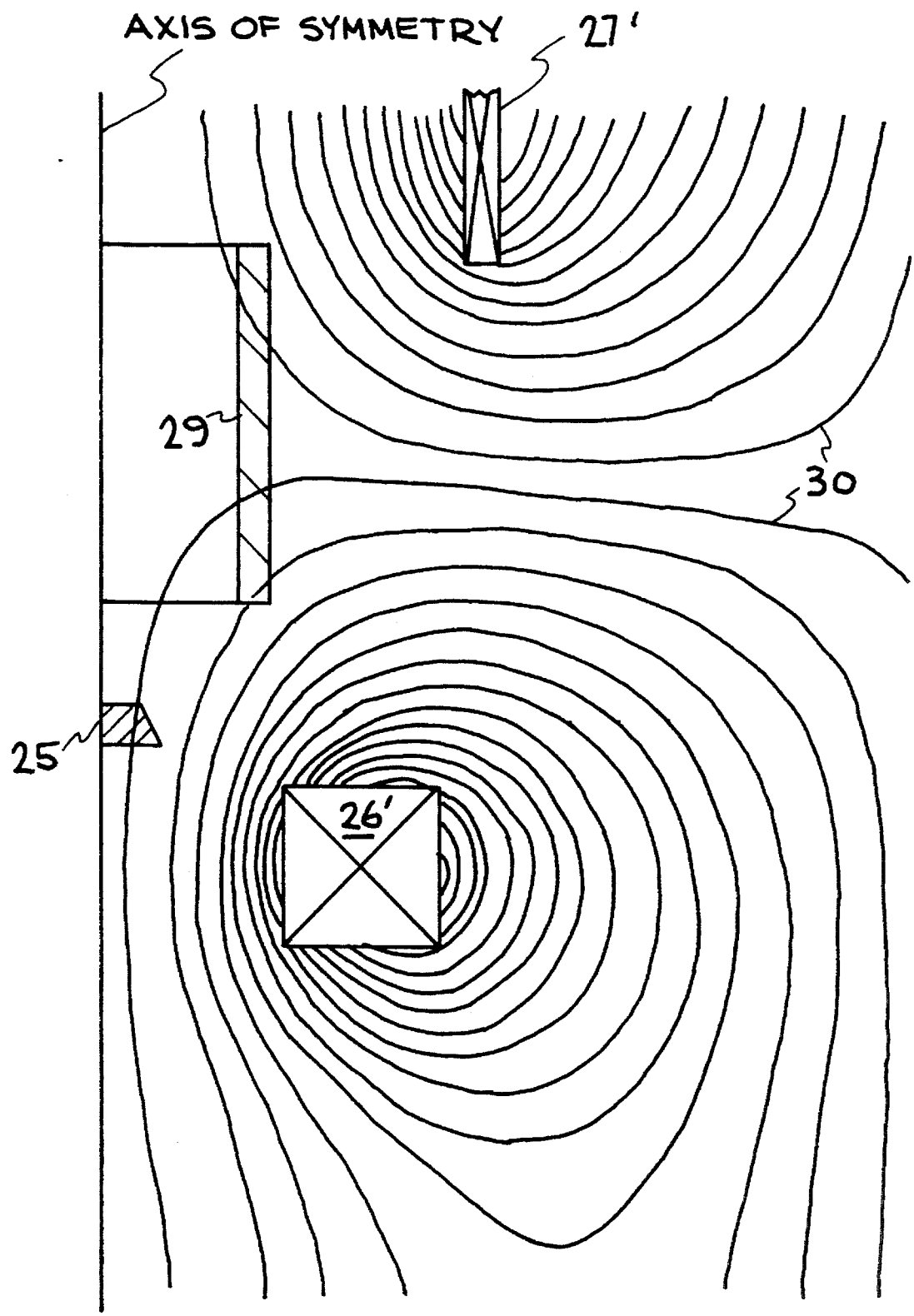
FIG. 3 illustrates a magnetic field plot along the axis of symmetry of the magnetic-cusp cathodic-arc source of the present invention.

Referring now to FIGS. 2 and 3, the magnetic-cusp, cathodic arc source of this invention comprises a cathode or target 25, having a configuration as described above with respect to cathode 12 of FIG. 1, located in the center of a short solenoid coil 26. At the surface of the cathode 25, the field is nearly parallel, and the arc is constrained to the end thereof by the sloped sides of the cathode. Located a short distance away is a similar solenoid coil 27 with the magnetic field direction being opposite to the field of coil 26, as seen in FIG. 3. This creates a plane of zero field between coils 26 and 27 as indicated at 28 in FIG. 2. At this zero field point, a hollow annular anode 29 is positioned, which results in a straight-through magnetic field as indicated at 30 toward a macro-particle filter, as indicated at arrow 31 in FIG. 2. Due to the magnetic fields produced by coils 26 and 27 and the 15° slope on the sides 32 of cathode (target) 25 the arc spot is confined to the end 33 of the cathode 25, and the spot moves randomly over the end surface of the cathode and uniformly erodes the cathode 25.

The cathode 25 may be of a standard type, as described in above-referenced U.S. Pat. No. 5,279,723, and known as an E-beam muffin, which may be composed of copper, titanium, graphite, or other conductive material, and is provided with an arc starter, not shown, positioned in shield 13 in spaced relation to the cathode 25. While not shown, the shield 13 also includes electrical power supply leads or lines for connection to appropriate external power sources and control mechanisms for the cathode 25 and anode 29. Also, while not shown, the coils 26 and 27 are connected to appropriate power supplies and control mechanism, which are standard in the art and need not be described or illustrated.

By way of example, the cathode may be constructed of titanium, having an end face or surface of a length or cross-section of ¾ to 2 inch, with the tapered sides being at 15°–20° with a length of ½ to 1.5 inch. The cathode may have an annular or circular end configuration. The coils 26 and 27 may have a diameter of 3 to 7 inches and width of 2 to 6 inches. The annular anode 29 may be constructed of copper having an internal diameter of 2 to 4 inches and external diameter of 2.5 to 4.5 inches, with a width of 2 to 6 inches. Coils 26 and 27 need not be of the same configuration as shown in FIG. 2, with coil 27' in FIG. 3 being of a different configuration than coil 26'. While copper is the preferred material for the anode, other conductive materials may be used.

The magnetic-cusp, cathodic-arc source illustrated in FIGS. 2 and 3 allows high magnetic fields required for good ion transport, yet provides a low impedance path for electrons from the cathode to the anode, giving good, stable arc discharges. As pointed out above, the cathodic-arc source of FIGS. 2 and 3 is well matched for the "knee-type" or bent magnetic macro-particle filter arrangement of above-referenced U.S. Pat. No. 5,279,723, but may be used in other applications requiring a straight-through magnetic field.

While particular embodiments, materials, parameters, etc. have been illustrated and/or described to set forth a description of the invention and its operation/function, such are not intended to be limiting. Modifications and changes will become apparent to those skilled in the art, and it is intended that the invention be limited only by the scope of the appended claims.

I claim:

1. A cathodic-arc source, comprising:

a cathode;

a first coil producing a first magnetic field, said cathode being positioned in the center of said first coil;

a second coil, axially aligned with said first coil and producing a second magnetic field in a direction opposite to the direction of said first magnetic field;

said first and second magnetic fields creating a plane of zero magnetic field between said first and second coils; and a hollow annular anode positioned intermediate said first and second coils and located in said plane of zero magnetic field;

whereby a straight-through magnetic field is produced for ion transport through said second coil while providing a low impedance path for electrons from said cathode to said anode creating stable arc discharges.

2. A cathodic-arc source of claim 1, additionally including cooling means for said cathode and said anode.

3. The cathodic-arc source of claim 1, wherein said cathode is configurated to include tapered side surfaces and a flat end surface interconnecting said side surfaces.

4. The cathodic-arc source of claim 1, wherein said first and second coils are of a solenoids.

5. The cathodic-arc source of claim 4, wherein said first and second coils are of a substantially identical configuration.

6. The cathodic-arc source of claim 4, wherein said first and second coils are of different configurations.

7. The cathodic-arc source of claim 1, in combination with a macro-particle filter assembly.

8. The combination of claim 7, wherein said macro-particle filter assembly is of a bent configuration, whereby ions produced by said cathode are directed through said filter assembly to a point of use, and macro-particles produced by said cathode are trapped in said filter assembly.

9. The combination of claim 8, wherein said macroparticle filter assembly is operatively connected to a vacuum chamber adapted for coating parts, such that ions produced by said cathode are directed into said vacuum chamber to a point of use.

10. In a filtered cathodic-arc ion source having a macrofilter assembly including a section bent at about 45°, the improvement comprising:

a magnetic-cusp cathodic-arc source including:

a cathode positioned within a first coil;

a second coil located in axially aligned spaced relation to said first coil;

said first and second coils producing oppositely extending magnetic fields which create a zero field plane therebetween; and a hollow annular anode positioned intermediate said first and second coils and in said zero field plane.

11. The improvement of claim 10, additionally including means for cooling the cathode and the anode.

12. The improvement of claim 10, wherein said cathode is provided with at least one tapering side surface.

13. The improvement of claim 12, wherein said side surface is tapered at about 15°–20°.

14. The improvement of claim 10, wherein said first and second coils are of solenoids.

15. The improvement of claim 14, wherein said second coil is of a different configuration than said first coil.

16. A cathodic arc ion source defining a magnetic cusp, and comprising:

a first solenoid coil;

a second solenoid coil located in axially aligned spaced relation to said first coil;

said first and second solenoid coils being constructed to produce magnetic field extending in opposite directions and defining a plane of zero magnetic field therebetween;

a cathode assembly including a cathode composed of target material;

at least said cathode of said cathode assembly being located in said first solenoid coil; and a hollow anode positioned intermediate said first and second solenoid coils and in said plane of zero magnetic field.

17. The ion source of claim 16, wherein said first and second solenoid coils are of substantially identical configurations.

18. The ion source of claim 16, wherein said first and second solenoid coils are of different configurations.

19. The ion source of claim 16, wherein said cathode is configured to have a substantially flat end face and at least one tapered side surface.

20. The ion source of claim 16, wherein said cathode assembly and said anode are provided with cooling means.

* * * * *